United States Patent [19]

Smith et al.

[11] Patent Number: 4,968,903

[45] Date of Patent: Nov. 6, 1990

[54] COMBINATIONAL STATIC CMOS LOGIC CIRCUIT

[75] Inventors: Stephen L. Smith, Tempe; Dean Mueller, Chandler, both of Ariz.

[73] Assignee: Motorola Inc., Schaumburg, Ill.

[21] Appl. No.: 389,202

[22] Filed: Aug. 3, 1989

[51] Int. Cl.$^5$ .............................. H03K 19/173
[52] U.S. Cl. ..................... 307/469; 307/451; 307/465
[58] Field of Search .............. 307/448, 451, 465, 468, 307/469

[56] References Cited

U.S. PATENT DOCUMENTS

| | | | |
|---|---|---|---|
| 4,453,096 | 6/1984 | Le Can et al. | 307/451 |
| 4,609,830 | 9/1986 | Brandman | 307/451 |
| 4,672,240 | 6/1987 | Smith et al. | 307/468 |
| 4,833,349 | 5/1989 | Liu et al. | 307/468 |

Primary Examiner—Stanley D. Miller
Assistant Examiner—T. Cunningham
Attorney, Agent, or Firm—Michael D. Bingham

[57] ABSTRACT

A combinational static CMOS logic circuit for providing a plurality of basic two-input logic functions with reduced complexity and integrated circuit area. The combinational static CMOS logic circuit provides either a NAND or an XOR output at a first output terminal and a NOR output at a second output terminal. A configuration input terminal is utilized for selecting between the NAND or the XOR output being provided at the first output terminal. In an alternate configuration, the combinational static CMOS logic circuit provides either a NOR or an XNOR output at a first output terminal and a NAND output at a second output terminal.

8 Claims, 4 Drawing Sheets

U.S. Patent     Nov. 6, 1990     Sheet 1 of 4     4,968,903
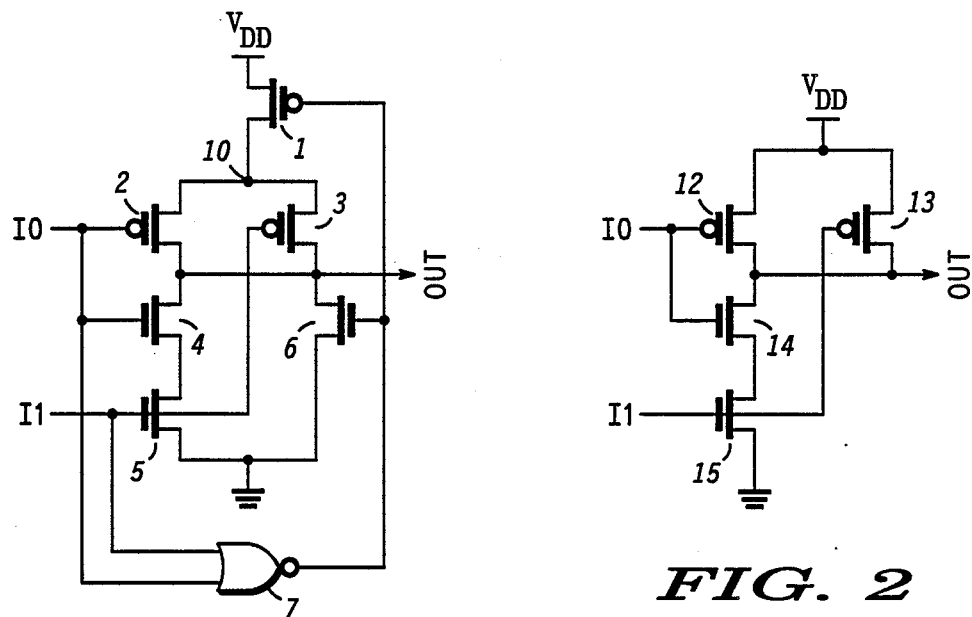
*FIG. 1*
—PRIOR ART—
*FIG. 2*
—PRIOR ART—
*FIG. 3*
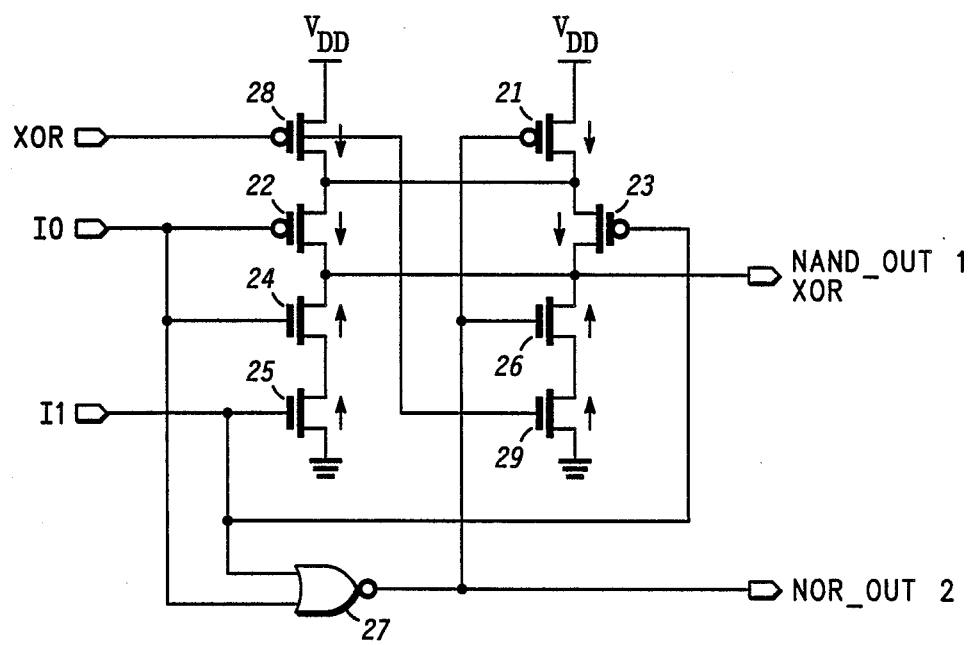

4,968,903

COMBINATIONAL STATIC CMOS LOGIC CIRCUIT

BACKGROUND OF THE INVENTION

This invention relates, in general, to CMOS logic circuits and, more particularly, to a combinational static CMOS circuit which provides all of the basic two-input logic circuits using fewer transistors and configuration logic signals than prior art circuits.

There are currently available CMOS logic circuits which provide all of the basic two-input logic functions. However, these circuits are generally simple combinations of the individual CMOS logic circuits with appropriate pass transistors to provide a single combination circuit which may by utilized to provide any of the desired two-input logic functions. These combination circuits require not only additional transistors and therefore integrated circuit space but their complexity ordinarily requires additional logic input signals to provide the desired configuration.

SUMMARY OF THE INVENTION

It is therefore an object of the present invention to provide a combinational static CMOS Logic Circuit which provides all of the basic two-input logic circuits with reduced complexity and corresponding reduced integrated circuit area.

The above and other features and objects are provided in the present invention wherein there is provided a combinational static CMOS logic circuit having first and second input terminals and first and second output terminals comprising first, second, third and fourth P-Channel MOS transistors and fifth, sixth, seventh and eighth N-channel MOS transistors each having a control terminal and first and second load terminals. The first load terminals of the first and second transistors are coupled to a source of supply voltage and the second load terminals of the first and second transistors are coupled together and coupled to the first load terminals of the third and fourth transistors. The second load terminals of the third and fourth transistors are coupled together, to the first load terminals of the fifth and sixth transistors and to the first output terminal. The second load terminals of the fifth and sixth transistors are respectively coupled to the first load terminals of the seventh and eighth transistors, the second load terminals of which are coupled to a reference terminal. The control terminal of the eighth transistor is coupled to the control terminal of the first transistor for coupling to a first logic configuration input terminal. The control terminals of the third and fifth transistors are coupled to the first input terminal and to the first input of a NOR gate having first and second input terminals and an output terminal. The control terminals of the fourth and seventh transistors are coupled to the second input terminal of the NOR gate and the output terminal of the NOR gate is coupled to the control terminals of the second and sixth transistors and to the second output terminal.

This basic configuration provides either a NAND or XOR output at the first output terminal and a NOR output at the second output terminal in response to inputs at the first and second input terminals. A NAND output of the logic signals applied to the first and second input terminals is provided with a logic low signal applied to the first logic configuration input terminal and an XOR output of the first and second input terminals is provided with a logic high signal applied to the first logic configuration input terminal.

In order to provide a circuit with a single output the basic configuration described above may be combined with ninth and tenth CMOS pass transistors, an inverter and an eleventh P-channel CMOS transistor to form a circuit with a single output terminal. The control terminals of the ninth and tenth transistors are respectively coupled to second and third logic configuration input terminals. The first load terminal of the ninth transistor is coupled to the first output terminal and the first load terminal of the tenth transistor is coupled to the second output terminal. The first input terminal of the eleventh transistor is coupled to a source of supply voltage and the second load terminals of the ninth, tenth and eleventh transistors are coupled to the input terminal of the inverter, the output of which is coupled to the control terminal of the eleventh transistor and to a combined output terminal.

BRIEF DESCRIPTION OF THE DRAWINGS

The above mentioned and other features of the invention and the manner of attaining them will become more apparent in the invention itself would be best understood by reference to the following description of embodiments of the invention taken in conjunction with the accompanying drawings, wherein:

FIG. 1 is a schematic diagram of a typical prior art CMOS XOR circuit;

FIG. 2 is a schematic diagram of a typical prior art CMOS NAND circuit;

FIG. 3 is a schematic diagram of the basic logic unit of the present invention;

DETAILED DESCRIPTION OF THE DRAWINGS

Figure 4:
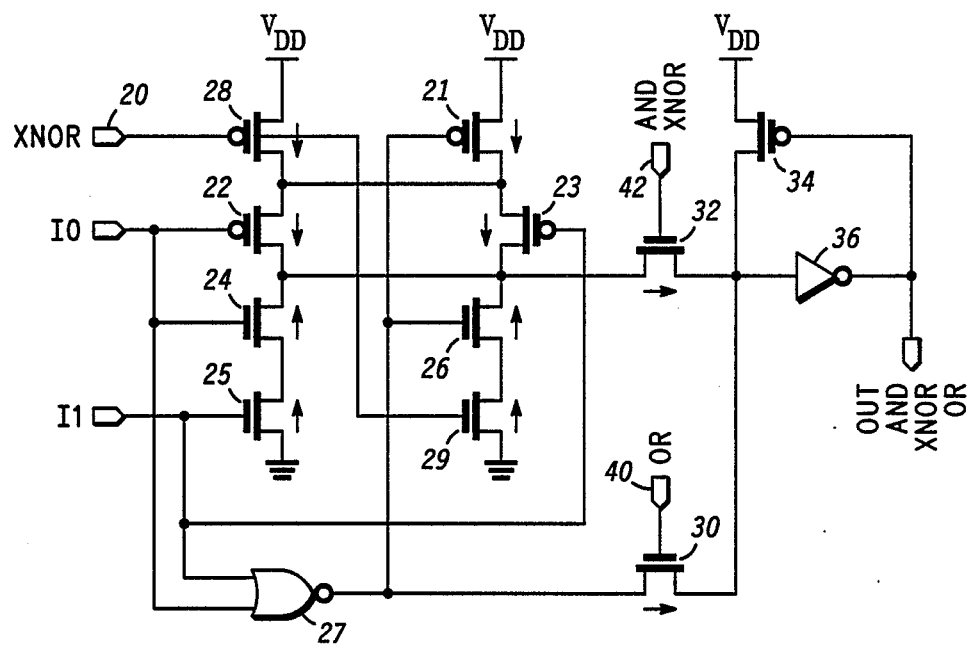
FIG. 4 is a schematic diagram of a preferred embodiment of the present invention including a buffered output.

FIG. 1, FIG. 2, FIG. 5 and FIG. 6 respectively show typical prior art CMOS basic logic circuits for the XOR, NAND, XNOR and NOR logic functions. For example, the output signal at the output terminal of the circuit of FIG. 1 would be high if either input 0 or input 1 is high but not if both are low or if both are high, thereby providing the logic function XOR of the two inputs I0 and I1. As can be seen the output of NOR gate 7 of FIG. 1 would by itself provide the logic function NOR for the combination of inputs I0 and I1. A typical prior art combination circuit would therefore comprise a circuit of FIG. 1 to provide the XOR logic function, the circuit of FIG. 2 to provide the NAND logic function and the circuit of FIG. 6 to provide the NOR function. The resultant combination circuit to provide the logic functions XOR, NOR and NAND would therefore comprise a combination of the circuits of FIGS. 1, 2 and 6 and result in a combination circuit having 18 transistors and having 3 separate output terminals. These 3 outputs would ordinarily then be combined using a pass transistor and corresponding configuration logic input terminal for each.

However, a close look at the circuit of FIG. 1 shows that it could be modified to provide the NAND function of FIG. 2 with the addition of 2 transistors. Transistors 2, 3, 4 and 5 would comprise a circuit identical to that of FIG. 2 if node 10 of Figure 1 were coupled to the source of supply voltage and transistor 6 of FIG. 1 were eliminated. This is accomplished in the circuit of applicants' invention shown in FIG. 3 by using transistor 28 to bypass transistor 21 and by using transistor 29 to open the path from transistor 26 to ground thereby eliminating transistor 26. These modifications are both accomplished when a low level logic signal is applied to the XOR input terminal 20 of FIG. 3.

FIG. 3 is a schematic of the present invention comprising P channel CMOS transistors 21, 22, 23 and 28; N channel CMOS transistors 24, 25, 26 and 29; and NOR gate 27. The source terminals of transistors 21 and 28 are connected to a source of supply voltage. The gate terminals of transistors 28 and 29 are coupled together for coupling to a first configuration input terminal. The drain terminals of transistors 21 and 28 are coupled to each other and to the source terminals of transistors 22 and 23, the drain terminals of which are coupled to each other, to the drain terminals of transistors 24 and 26 and to the first output terminal. The source terminals of transistors 24 and 26 are respectively coupled to the drain terminals of transistors 5 and 29 the source terminals of which are coupled to a ground reference. The gate terminals of transistors 22 and 24 are coupled to the first input terminal and to the first input terminal of NOR gate 27. The gate terminals of transistors 25 and 23 are coupled to the second input terminal and to the second input terminal of NOR gate 27, the output of which is coupled to the gate terminals of transistors 21 and 26 and to the second output terminal.

In operation NOR gate 27, operating in normal NOR gate fashion, combines the signals from the first and second inputs to provide a NOR output at output terminal 2. With a logic high signal applied to the first configuration logic terminal coupled to the gates of transistors 28 and 29, transistor 28 would be off and therefore functionally removed from the circuit and transistor 29 would be turned on thereby coupling the source terminal of transistor 26 directly to ground. This would result in the basic XOR configuration of the circuit of Figure 1, wherein transistors 1, 2, 3, 4, 5 and 6 would correspond respectively to transistors 21, 22, 23, 24, 25 and 26 of the circuit of FIG. 3. NOR gate 27 of FIG. 3 provides the same function and is connected the same as NOR gate 7 of FIG. 1. Therefore, output 1 would provide the logical XOR combination of inputs 1 and 2 with a high signal applied to first configuration input terminal 20.

Applying a low logic signal to configuration input terminal 20 turns on transistor 28 thereby coupling the source terminals of transistors 22 and 23 to the source of supply voltage. In addition transistor 29 is turned off thereby functionally removing transistor 26 from the circuit. This results in the basic NAND function of FIG. 2 wherein transistors 12, 13, 14 and 15 of the circuit in FIG. 2 respectively correspond to transistors 22, 23, 24 and 25 of the circuit of FIG. 3. In this configuration output number 1 of FIG. 3 would provide a NAND logical result from the inputs 10 and Il input to the circuit of FIG. 3. As can be seen the circuit of FIG. 3 now provides the basic NAND, XOR and NOR functions utilizing the basic XOR circuit of FIG. 1 with the addition of transistors 28 and 29 and utilizing one additional configuration input logic signal.

Figure 9:
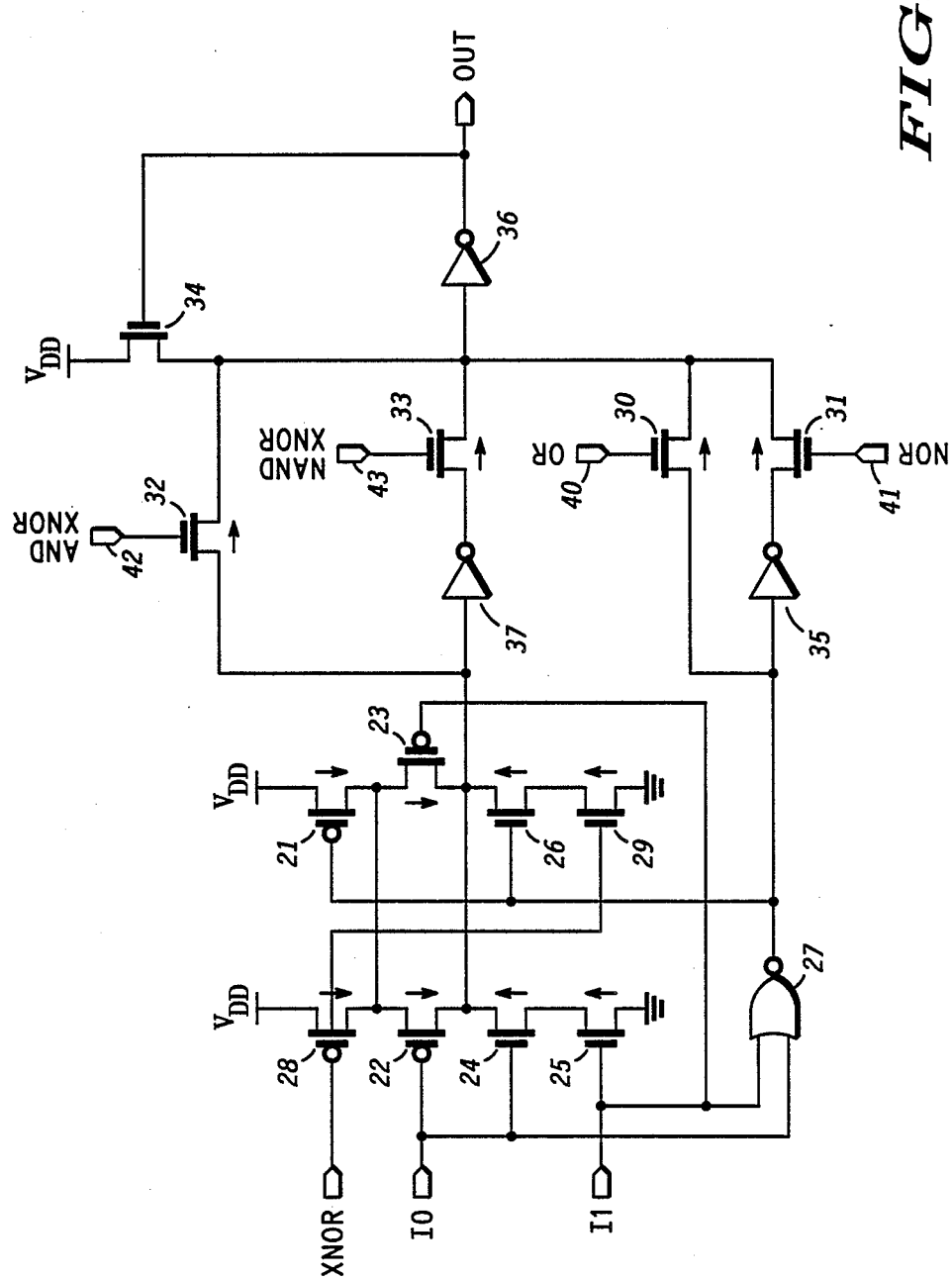
FIG. 9 is a schematic diagram of the preferred embodiment of FIG. 4 with additional inverters and pass transistors.

FIG. 4 shows this basic logic unit with the addition of pass transistors 30 and 32 and logic configuration input signals 40 and 42 to provide a single output circuit. Transistors 21, 22, 23, 24, 25, 26, 28 and 29 as well as NOR gate 27 are coupled as in FIG. 3. The terminal labeled as OUT 1 in FIG. 3 is now coupled to the source terminal of N channel transistor 32 and the terminal labeled as OUT 2 IN FIG. 3 is now coupled to the source terminal of N channel transistor 30. The drain terminals of transistors 30 and 32 are coupled to the drain terminal of transistor 34 and to the input terminal of inverter 36 the output of which is coupled to the gate terminal of P channel transistor 34 the source terminal of which is coupled to the source of supply voltage. The gate terminal of transistor 30 is coupled to a second logic configuration input terminal 40 and the gate terminal of transistor 32 is coupled to a third logic configuration input terminal 42. The output of inverter 36 now becomes a single output providing either AND, XNOR, or OR outputs from inputs 10 and Il depending on the logic signals applied to the first, second and third logic configuration input terminals. To provide an AND function a high signal would be applied t logic configuration input terminal 42 and a low signal to terminal 20. To provide an OR function a logic high signal would be applied to logic configuration input terminal 40 and to provide an XNOR function a logic high signal would be applied to logic configuration input terminals 20 and 42. Pass transistors 30 and 32, inverter 36 and transistor 34 are used in a normal combination buffer as is well known to those skilled in the art. Assuming NOR gate 27 to be the standard four transistor circuit shown in FIG. 6 and inverter 36 to comprise two transistors, it can be seen that the circuit of FIG. 4 accomplishes the basic AND, XNOR and OR logic functions with 17 transistors and 3 logic configuration control signals. The full compliment of all 6 basic logic operations on the two input signals may be accomplished with the addition of 2 inverters, 2 transistors, and 2 corresponding logic configuration input terminals as shown in FIG. 9.

Figure 5:
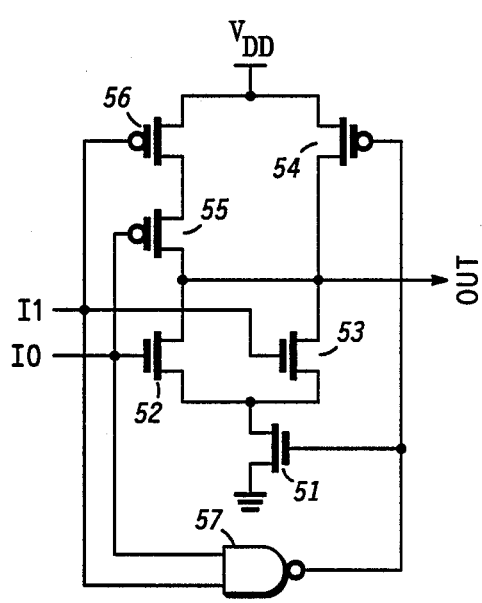
FIG. 5 is a schematic diagram of a typical prior art CMOS XNOR circuit.
Figure 6:
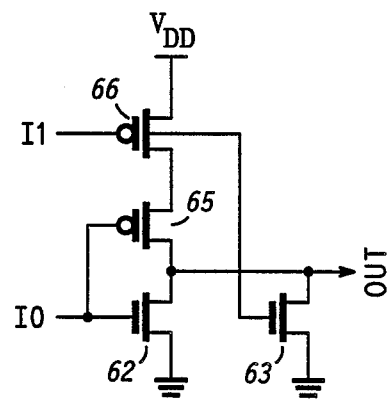
FIG. 6 is a schematic diagram of a typical prior art CMOS NOR circuit.
Figure 7:
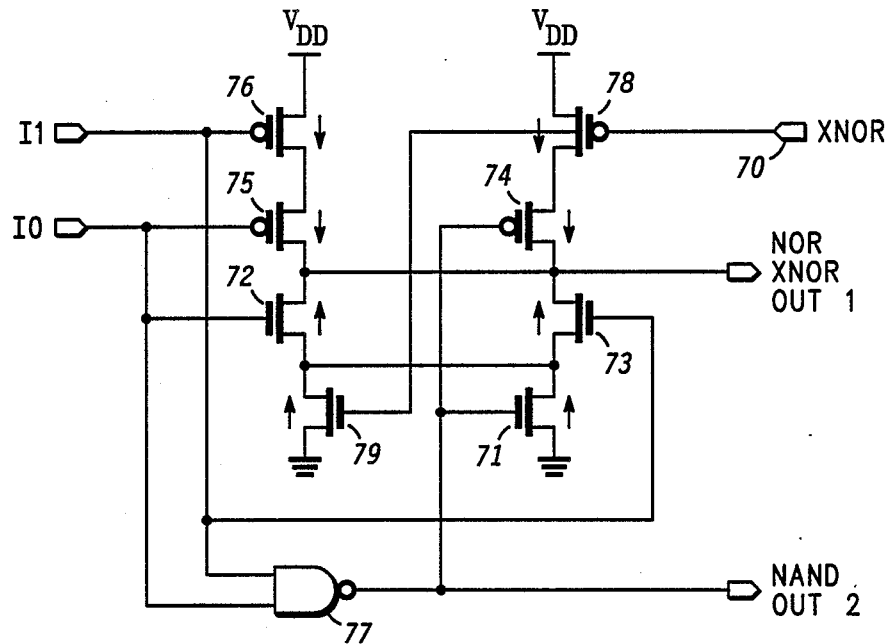
FIG. 7 is a schematic diagram of an alternative embodiment of the basic logic unit of the present invention.

A similar dual function circuit may be accomplished utilizing the prior art XNOR schematic of FIG. 5. As can be seen in FIG. 7, the basic NOR schematic of FIG. 6 may be accomplished utilizing the XNOR schematic of FIG. 5 by using transistor 78 to functionally eliminate transistor 74 from the circuit of FIG. 7 and by utilizing transistor 79 to directly couple the source terminals of transistors 72 and 73 to a ground reference. In this configuration transistors 76, 75, 72 and 73 of FIG. 7 correspond to transistors 66, 65, 62 and 63 of the basic NOR schematic of FIG. 6. NAND gate 77 would be implemented as the standard four transistor circuit of FIG. 2.

Figure 8:
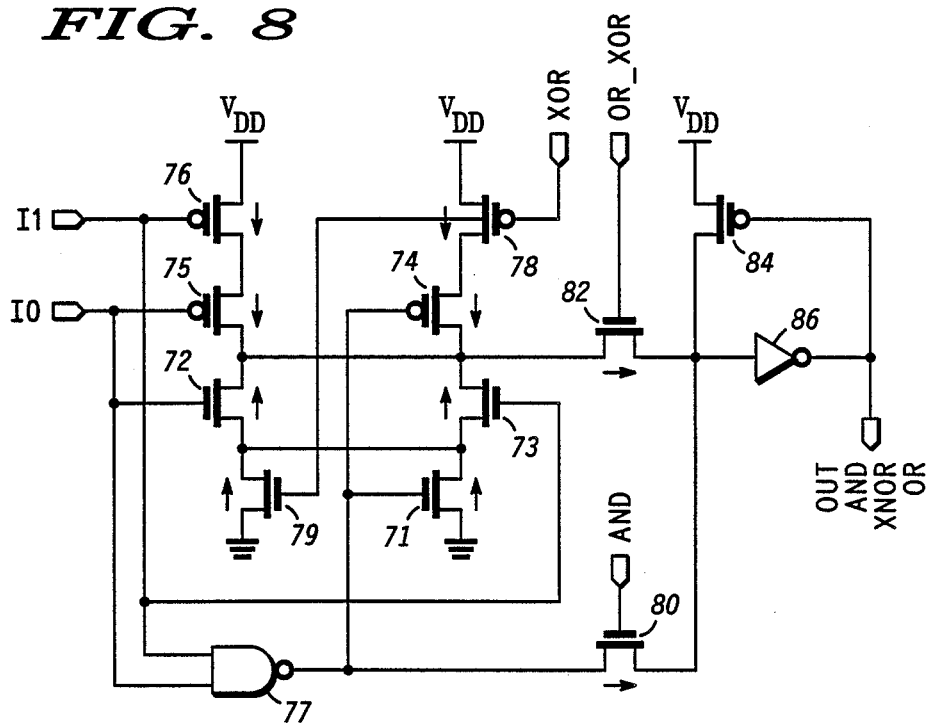
FIG. 8 is a schematic diagram of the alternative embodiment of the present invention including a buffered output stage.

With a low signal applied to the gate terminals of transistors 78 and 79 via logic configuration terminal 70, transistor 78 is turned on thereby coupling transistor 74 directly to the source of supply voltage and transistor 79 is turned off allowing transistor 71 to function as in the prior art XNOR circuit of FIG. 5. This basic logic circuit is utilized with pass transistors 80 and 82 and inverter 86 to provide a single output circuit as shown in FIG. 8. As with the previous embodiment, a full 6 function circuit may be accomplished with the addition of 2 inverters, 2 pass transistors, and 2 corresponding logic configuration input terminals in a form similar to that shown in FIG. 9.

What has been provided therefore is a combinational static CMOS logic circuit which provides AND, XNOR, and OR logic functions utilizing fewer transistors and control signals than a conventional combination circuit of the basic AND XNOR and OR functions. In an alternative embodiment the basic OR, XOR, and AND functions are provided again utilizing fewer components than previously required. While there have been described above the principles of the invention and specific configurations and conjunction with specific circuits, and is to be clearly understood that this description is made only by way of example and not as a limitation to the scope of the invention.

We claim:

1. A logic circuit having first and second input terminals, a first configuration terminal and first and second output terminals, said circuit comprising;
   first, second, third and fourth transistors, each having a control terminal and first and second load terminals, said first load terminals of said first and second transistors are coupled to a source of supply voltage and said second load terminals of said first and second transistors coupled together and to said first load terminals of said third and fourth transistors;
   fifth, sixth, seventh and eighth transistors, each having a control terminal and first and second load terminals, said second load terminals of said third and fourth transistors coupled to said first load terminals of said fifth and sixth transistors and to said first output terminal, said second load terminals of said fifth and sixth transistors respectively coupled to said first load terminals of said seventh and eighth transistors, said second load terminals of said seventh and eighth transistors coupled to a voltage reference and said control terminals of said first and eighth transistors coupled to said first configuration terminal; and
   a logic NOR circuit having first and second input terminals and an output terminal, said control terminals of said fourth and seventh transistors coupled to said second input terminal and to said first input terminal of said logic NOR circuit, said control terminals of said third and fifth transistors coupled to said first input terminal and to said second input terminal of said logic NOR circuit, and said control terminals of said second and sixth transistors coupled to said second output terminal and to said output terminal of said logic NOR circuit;
   wherein each of said first, second, third and fourth transistors is responsive to a logic low signal at its control terminal and each of said fifth, sixth, seventh and eighth transistors is responsive to a logic high signal at its control terminal.

2. A logic circuit in accordance with claim 1 wherein said first, second, third and fourth transistors are P-channel MOS transistors and said fifth, sixth, seventh and eighth transistors are N-channel MOS transistors.

3. A logic circuit in accordance with claim 1 further comprising ninth, tenth and eleventh transistors each having a control terminal and first and second load terminals and an inverter having an input and an output terminal, said first load terminals of said ninth and tenth transistors respectively coupled to said first and second output terminals, said first load terminal of said eleventh transistor coupled to a source of supply voltage, said second load terminals of said ninth, tenth and eleventh transistors coupled to said input terminal of said inverter, said control terminals of said ninth and tenth transistors coupled respectively to second and third configuration terminals and said output terminal of said inverter coupled to said control terminal of said eleventh transistor and to a combined output terminal.

4. A logic circuit in accordance with claim 3 wherein said first, second, third, fourth and eleventh transistors are P-channel MOS transistors and said fifth, sixth, seventh, eighth, ninth and tenth transistors are N-channel MOS transistors.

5. A logic circuit having first and second input terminals, a first configuration terminal and first and second output terminals, said circuit comprising;
   first, second, third and fourth transistors, each having a control terminal and first and second load terminals, said first load terminals of said first and second transistors are coupled to a source of supply voltage and said second load terminals of said first and second transistors respectively coupled to said first load terminals of said third and fourth transistors;
   fifth, sixth, seventh and eighth transistors, each having a control terminal and first and second load terminals, said second load terminals of said third and fourth transistors coupled to said first load terminals of said fifth and sixth transistors and to said first output terminal, said second load terminals of said fifth and sixth transistors coupled together and to said first load terminals of said seventh and eighth transistors, said second load terminals of said seventh and eighth transistors coupled to a voltage reference and said control terminals of said second and seventh transistors coupled to said first configuration terminal; and
   a logic NAND circuit having first and second input terminals and an output terminal, said control terminals of said first and sixth transistors coupled to said second input terminal and to said first input terminal of said logic NAND circuit, said control terminals of said third and fifth transistors coupled to said first input terminal and to said second input terminal of said logic NAND circuit, and said control terminals of said fourth and eighth transistors coupled to said second output terminal and to said output terminal of said logic NAND circuit;
   wherein each of said first, second, third and fourth transistors is responsive to a logic low signal at its control terminal and each of said fifth, sixth, seventh and eighth transistors is responsive to a logic high signal at its control terminal.

6. A logic circuit in accordance with claim 5 wherein said first, second, third and fourth transistors are P-channel MOS transistors and said fifth, sixth, seventh and eighth transistors are N-channel MOS transistors.

7. A logic circuit in accordance with claim 5 further comprising ninth, tenth and eleventh transistors each having a control terminal and first and second load terminals and an inverter having an input and an output terminal, said first load terminals of said ninth and tenth transistors respectively coupled to said first and second output terminals, said first load terminal of said eleventh transistor coupled to a source of supply voltage, said second load terminals of said ninth, tenth and eleventh transistors coupled to said input terminal of said inverter, said control terminals of said ninth and tenth transistors coupled respectively to second and third configuration terminals and said output terminal of said inverter coupled to said control terminal of said eleventh transistor and to a combined output terminal.

8. A logic circuit in accordance with claim 7 wherein said first, second, third, fourth and eleventh transistors are P-channel MOS transistors and said fifth, sixth, seventh, eighth, ninth and tenth transistors are N-channel MOS transistors.

* * * * *